(12) United States Patent
Vasilache

(10) Patent No.: US 11,475,904 B2
(45) Date of Patent: Oct. 18, 2022

(54) QUANTIZATION OF SPATIAL AUDIO PARAMETERS

(71) Applicant: Nokia Technologies Oy, Espoo (FI)

(72) Inventor: Adriana Vasilache, Tampere (FI)

(73) Assignee: NOKIA TECHNOLOGIES OY, Espoo (FI)

(*) Notice: Subject to any disclaimer, the term of this patent is extended or adjusted under 35 U.S.C. 154(b) by 0 days.

(21) Appl. No.: 17/043,024

(22) PCT Filed: Apr. 2, 2019

(86) PCT No.: PCT/FI2019/050264
§ 371 (c)(1),
(2) Date: Sep. 29, 2020

(87) PCT Pub. No.: WO2019/197713
PCT Pub. Date: Oct. 17, 2019

(65) Prior Publication Data
US 2021/0020185 A1 Jan. 21, 2021

(30) Foreign Application Priority Data
Apr. 9, 2018 (GB) .................................. 1805833

(51) Int. Cl.
*G10L 19/035* (2013.01)
*G10L 19/008* (2013.01)
*H03M 7/30* (2006.01)
*G10L 19/00* (2013.01)

(52) U.S. Cl.
CPC .......... *G10L 19/035* (2013.01); *G10L 19/008* (2013.01); *H03M 7/6011* (2013.01); *G10L 2019/0001* (2013.01)

(58) Field of Classification Search
None
See application file for complete search history.

(56) References Cited

U.S. PATENT DOCUMENTS

| 6,192,336 | B1 | 2/2001 | Manduchi et al. | |
| 9,699,583 | B1* | 7/2017 | Lyren | H04R 5/033 |
| 2008/0015852 | A1 | 1/2008 | Kruger et al. | |
| 2009/0252356 | A1* | 10/2009 | Goodwin | G10L 19/173 |
| | | | | 381/310 |
| 2014/0355766 | A1* | 12/2014 | Morrell | G10L 19/008 |
| | | | | 381/18 |
| 2015/0296319 | A1 | 10/2015 | Shenoy et al. | |
| 2015/0332682 | A1* | 11/2015 | Kim | G10L 19/008 |
| | | | | 381/22 |

(Continued)

FOREIGN PATENT DOCUMENTS

| EP | 2860728 A1 | 4/2015 |
| GB | 2542579 A | 3/2017 |
| WO | WO 2009/067741 A1 | 6/2009 |

(Continued)

OTHER PUBLICATIONS

Search Report received for corresponding European Patent Application No. 1805833.9, dated Oct. 10, 2018, 3 pages.

(Continued)

*Primary Examiner* — Shaun Roberts
(74) *Attorney, Agent, or Firm* — Alston & Bird LLP

(57) ABSTRACT

There is disclosed inter alia an apparatus for spatial audio signal encoding which determines at least one spatial audio parameter comprising a direction parameter with an elevation component and an azimuth component. The elevation component and azimuth component of the direction parameter are then converted to an index value.

13 Claims, 13 Drawing Sheets

(56) References Cited

U.S. PATENT DOCUMENTS

| | | | | |
|---|---|---|---|---|
| 2016/0142851 A1* | 5/2016 | Sun | ................. | H04R 29/002 |
| | | | | 381/20 |
| 2017/0103766 A1* | 4/2017 | Kim | ................. | H04S 7/30 |
| 2017/0154633 A1* | 6/2017 | Krueger | ................. | H04S 3/02 |
| 2017/0366913 A1 | 12/2017 | Stein et al. | | |

FOREIGN PATENT DOCUMENTS

| | | |
|---|---|---|
| WO | 2018/028779 A1 | 2/2018 |
| WO | 2019/091575 A1 | 5/2019 |
| WO | 2019/097018 A1 | 5/2019 |
| WO | 2019/129350 A1 | 7/2019 |

OTHER PUBLICATIONS

International Search Report and Written Opinion received for corresponding Patent Cooperation Treaty Application No. PCT/FI2019/050264, dated Jul. 9, 2019, 17 pages.

Li et al., "The Perceptual Lossless Quantization of Spatial Parameter for 3D Audio Signals", International Conference on Multimedia Modeling, 2017, pp. 381-392.

Matschkal et al., "Spherical Logarithmic Quantization", IEEE Transactions on Audio, Speech, and Language Processing, vol. 18, No. 1, Jan. 2010, pp. 126-140.

Hamkins et al., "Gaussian Source Coding With Spherical Codes", IEEE Transactions on Information Theory, vol. 48, No. 11, Nov. 2002, pp. 2980-2989.

"Proposal for MASA format", 3GPP TSG-SA4#102 meeting, Tdoc S4 (19)0121, Agenda : 7.5—IVAS_Codec, Nokia Corporation, Jan. 28-Feb. 1, 2019, pp. 1-10.

Search Report for United Kingdom Application No. GB1805833.9 dated Oct. 9, 2018, 1 page.

Office Action for Indian Application No. 202047045728 dated Dec. 3, 2021, 8 pages.

* cited by examiner

QUANTIZATION OF SPATIAL AUDIO PARAMETERS

RELATED APPLICATION

This application claims priority to PCT Application No. PCT/FI2019/050264, filed on Apr. 2, 2019, which claims priority to GB Application No. 1805833.9, filed on Apr. 9, 2018, each of which is incorporated herein by reference in its entirety.

FIELD

The present application relates to apparatus and methods for sound-field related parameter encoding, but not exclusively for time-frequency domain direction related parameter encoding for an audio encoder and decoder.

BACKGROUND

Parametric spatial audio processing is a field of audio signal processing where the spatial aspect of the sound is described using a set of parameters. For example, in parametric spatial audio capture from microphone arrays, it is a typical and an effective choice to estimate from the microphone array signals a set of parameters such as directions of the sound in frequency bands, and the ratios between the directional and non-directional parts of the captured sound in frequency bands. These parameters are known to well describe the perceptual spatial properties of the captured sound at the position of the microphone array. These parameters can be utilized in synthesis of the spatial sound accordingly, for headphones binaurally, for loudspeakers, or to other formats, such as Ambisonics.

The directions and direct-to-total energy ratios in frequency bands are thus a parameterization that is particularly effective for spatial audio capture.

A parameter set consisting of a direction parameter in frequency bands and an energy ratio parameter in frequency bands (indicating the directionality of the sound) can be also utilized as the spatial metadata for an audio codec. For example, these parameters can be estimated from microphone-array captured audio signals, and for example a stereo signal can be generated from the microphone array signals to be conveyed with the spatial metadata. The stereo signal could be encoded, for example, with an AAC encoder. A decoder can decode the audio signals into PCM signals, and process the sound in frequency bands (using the spatial metadata) to obtain the spatial output, for example a binaural output.

The aforementioned solution is particularly suitable for encoding captured spatial sound from microphone arrays (e.g., in mobile phones, VR cameras, stand-alone microphone arrays). However, it may be desirable for such an encoder to have also other input types than microphone-array captured signals, for example, loudspeaker signals, audio object signals, or Ambisonic signals.

Analysing first-order Ambisonics (FOA) inputs for spatial metadata extraction has been thoroughly documented in scientific literature related to Directional Audio Coding (DirAC) and Harmonic planewave expansion (Harpex). This is since there exist microphone arrays directly providing a FOA signal (more accurately: its variant, the B-format signal), and analysing such an input has thus been a point of study in the field.

A further input for the encoder is also multi-channel loudspeaker input, such as 5.1 or 7.1 channel surround inputs.

However with respect to the directional components of the metadata, which may comprise an elevation, azimuth (and diffuseness) of a resulting direction, for each considered time/frequency subband a quantization and/or encoding which implements uniform granularity along the azimuth and the elevation components separately (when these two parameters are separately added to the metadata) can result in an uneven distribution of quantization and encoding states. For example a uniform approach to both separately results in an encoding scheme with a higher density nearer the 'poles' of the direction sphere, in other words directly above or below the locus or reference location.

SUMMARY

According to a first aspect there is a method for spatial audio signal encoding comprising: determining, for two or more audio signals, at least one spatial audio parameter for providing spatial audio reproduction, the at least one spatial audio parameter comprising a direction parameter with an elevation component and an azimuth component; converting the elevation component and azimuth component of the direction parameter to an index value.

The converting the elevation component and azimuth component of the direction parameter to an index value may comprise indexing the elevation component to a first indexed elevation value and indexing the azimuth component to a first indexed azimuth value dependent on the first indexed elevation value; indexing the elevation component to at least a second indexed elevation value and indexing the azimuth component to at least a second indexed azimuth value dependent on the second indexed elevation value; and selecting one of the first indexed elevation value and first indexed azimuth value or the at least one second indexed elevation value and the at least one second indexed azimuth value as an indexed elevation component and indexed azimuth component.

The selecting may comprise: determining a first distance between a point on a sphere given by the elevation component and azimuth component and a point on the sphere given by the first indexed elevation value and first indexed azimuth value; determining at least one second distance between a point on the sphere given by the elevation and azimuth component and a point on the sphere given by the at least one second indexed elevation value and the at least one second indexed azimuth value; and selecting one of the first indexed elevation value and first indexed azimuth value or the at least one second indexed elevation value and the at least one second indexed azimuth value as the indexed elevation component and indexed azimuth component dependent on a minimum of the first distance and the second distance.

The first distance and the second distance may each a L2 norm distance measured between two points on the sphere.

The elevation component and azimuth component may be indexed to a point on a spherical grid, wherein the spherical grid comprises a number of points arranged in a form of a sphere.

The spherical grid maybe formed by covering the sphere with smaller spheres, wherein the smaller spheres define the points of the spherical grid.

The elevation component and the azimuth component may each be indexed to a codebook comprising a plurality of indexed elevation values and indexed azimuth values.

Each indexed elevation value within the codebook may be associated with a number of indexed azimuth values.

The indexing may comprise scalar quantizing to an indexed value.

The elevation component and azimuth component may be components of an azimuth/elevation vector, in which converting the elevation component and azimuth component of the direction parameter to an index value may then comprise: determining a first distance measure between the azimuth/elevation vector and a first azimuth/elevation codevector from a vector codebook comprising a plurality of azimuth/elevation codevectors and determining at least a second distance measure between the azimuth/elevation vector and at least a second azimuth/elevation codevector from the vector codebook; selecting a minimum distance measure from the first distance measure and the at least second distance measure; and assigning the index value as the index of the azimuth/elevation codevector associated with the minimum distance measure.

As before the first distance and the second distance may be each a L2 norm distance measured between two points on a sphere.

The sphere may be a unitary sphere, and the L2 norm distance between the two points on the unitary sphere may be of the form $-(\sin(\theta_1)\sin(\theta_2)+\cos(\theta_1)\cos(\theta_2)\cos(\phi_1-\phi_2))$, wherein $\theta_1$ and $\theta_2$ are elevation values for a first point and a second point of the two points, wherein and $\phi_1$ and $\phi_2$ are azimuth values for the first and second points of the two points.

There is provided according to a second aspect an apparatus for spatial audio signal encoding comprising: means for determining, for two or more audio signals, at least one spatial audio parameter for providing spatial audio reproduction, the at least one spatial audio parameter comprising a direction parameter with an elevation component and an azimuth component; means for converting the elevation component and azimuth component of the direction parameter to an index value.

The means for converting the elevation component and azimuth component of the direction parameter to an index value may comprise means for indexing the elevation component to a first indexed elevation value and indexing the azimuth component to a first indexed azimuth value dependent on the first indexed elevation value; means for indexing the elevation component to at least a second indexed elevation value and indexing the azimuth component to at least a second indexed azimuth value dependent on the second indexed elevation value; and means for selecting one of the first indexed elevation value and first indexed azimuth value or the at least one second indexed elevation value and the at least one second indexed azimuth value as an indexed elevation component and indexed azimuth component.

The means for selecting may comprise: determining a first distance between a point on a sphere given by the elevation component and azimuth component and a point on the sphere given by the first indexed elevation value and first indexed azimuth value; determining at least one second distance between a point on the sphere given by the elevation and azimuth component and a point on the sphere given by the at least one second indexed elevation value and the at least one second indexed azimuth value; and selecting one of the first indexed elevation value and first indexed azimuth value or the at least one second indexed elevation value and the at least one second indexed azimuth value as the indexed elevation component and indexed azimuth component dependent on a minimum of the first distance and the second distance.

The first distance and the second distance may each be a L2 norm distance measured between two points on the sphere.

The elevation component and azimuth component may be indexed to a point on a spherical grid, wherein the spherical grid comprises a number of points arranged in a form of a sphere.

The spherical grid may be formed by covering the sphere with smaller spheres, wherein the smaller spheres define the points of the spherical grid.

The elevation component and the azimuth component may each be indexed to a codebook comprising a plurality of indexed elevation values and indexed azimuth values.

Each indexed elevation value within the codebook may be associated with a number of indexed azimuth values.

The means for indexing may comprise means for scalar quantizing to an indexed value.

The elevation component and azimuth component may be components of an azimuth/elevation vector, in which converting the elevation component and azimuth component of the direction parameter to an index value may then comprise: determining a first distance measure between the azimuth/elevation vector and a first azimuth/elevation codevector from a vector codebook comprising a plurality of azimuth/elevation codevectors and determining at least a second distance measure between the azimuth/elevation vector and at least a second azimuth/elevation codevector from the vector codebook; selecting a minimum distance measure from the first distance measure and the at least second distance measure; and assigning the index value as the index of the azimuth/elevation codevector associated with the minimum distance measure.

As before the first distance and the second distance may be each a L2 norm distance measured between two points on a sphere.

The sphere may be a unitary sphere and the L2 norm distance between the two points on the unitary sphere may be of the form $-(\sin(\theta_1)\sin(\theta_2)+\cos(\theta_1)\cos(\theta_2)\cos(\phi_1-\phi_2))$, wherein $\theta_1$ and $\theta_2$ are elevation values for a first point and a second point of the two points, wherein and $\phi_1$ and $\phi_2$ are azimuth values for the first and second points of the two points.

According to a further aspect there is provided an apparatus comprising at least one processor and at least one memory including computer program code, the at least one memory and the computer program code configured to, with the at least one processor, cause the apparatus to: determine, for two or more audio signals, at least one spatial audio parameter for providing spatial audio reproduction, the at least one spatial audio parameter comprising a direction parameter with an elevation component and an azimuth component; convert the elevation component and azimuth component of the direction parameter to an index value.

The apparatus caused to convert the elevation component and azimuth component of the direction parameter to an index value may be caused to index the elevation component to a first indexed elevation value and indexing the azimuth component to a first indexed azimuth value dependent on the first indexed elevation value; index the elevation component to at least a second indexed elevation value and index the azimuth component to at least a second indexed azimuth value dependent on the second indexed elevation value; and select one of the first indexed elevation value and first indexed azimuth value or the at least one second indexed elevation value and the at least one second indexed azimuth value as an indexed elevation component and indexed azimuth component.

The apparatus caused to select may be caused to: determine a first distance between a point on a sphere given by the elevation component and azimuth component and a point on the sphere given by the first indexed elevation value and first indexed azimuth value; determine at least one second distance between a point on the sphere given by the elevation and azimuth component and a point on the sphere given by the at least one second indexed elevation value and the at least one second indexed azimuth value; and select one of the first indexed elevation value and first indexed azimuth value or the at least one second indexed elevation value and the at least one second indexed azimuth value as the indexed elevation component and indexed azimuth component dependent on a minimum of the first distance and the second distance.

The first distance and the second distance may each a L2 norm distance measured between two points on the sphere.

The elevation component and azimuth component may be indexed to a point on a spherical grid, wherein the spherical grid comprises a number of points arranged in a form of a sphere.

The spherical grid maybe formed by covering the sphere with smaller spheres, wherein the smaller spheres define the points of the spherical grid.

The elevation component and the azimuth component may each be indexed to a codebook comprising a plurality of indexed elevation values and indexed azimuth values.

Each indexed elevation value within the codebook may be associated with a number of indexed azimuth values.

The apparatus caused to index may be caused to scalar quantize to an indexed value.

The elevation component and azimuth component may be components of an azimuth/elevation vector, in which the apparatus which is caused to convert the elevation component and azimuth component of the direction parameter to an index value may then be caused to: determining a first distance measure between the azimuth/elevation vector and a first azimuth/elevation codevector from a vector codebook comprising a plurality of azimuth/elevation codevectors and determining at least a second distance measure between the azimuth/elevation vector and at least a second azimuth/elevation codevector from the vector codebook; selecting a minimum distance measure from the first distance measure and the at least second distance measure; and assigning the index value as the index of the azimuth/elevation codevector associated with the minimum distance measure.

As before the first distance and the second distance may be each a L2 norm distance measured between two points on a sphere.

The sphere may be a unitary sphere and the L2 norm distance between the two points on the unitary sphere may be of the form $-(\sin(\theta_1)\sin(\theta_2)+\cos(\theta_1)\cos(\theta_2)\cos(\phi_1-\phi_2))$, wherein $\theta_1$ and $\theta_2$ are elevation values for a first point and a second point of the two points, wherein and $\phi_1$ and $\phi_2$ are azimuth values for the first and second points of the two points.

A computer program comprising program instructions for causing a computer to perform the method as described above.

A computer program product stored on a medium may cause an apparatus to perform the method as described herein.

An electronic device may comprise apparatus as described herein.

A chipset may comprise apparatus as described herein.

Embodiments of the present application aim to address problems associated with the state of the art.

SUMMARY OF THE FIGURES

For a better understanding of the present application, reference will now be made by way of example to the accompanying drawings in which.

EMBODIMENTS OF THE APPLICATION

Figure 1:
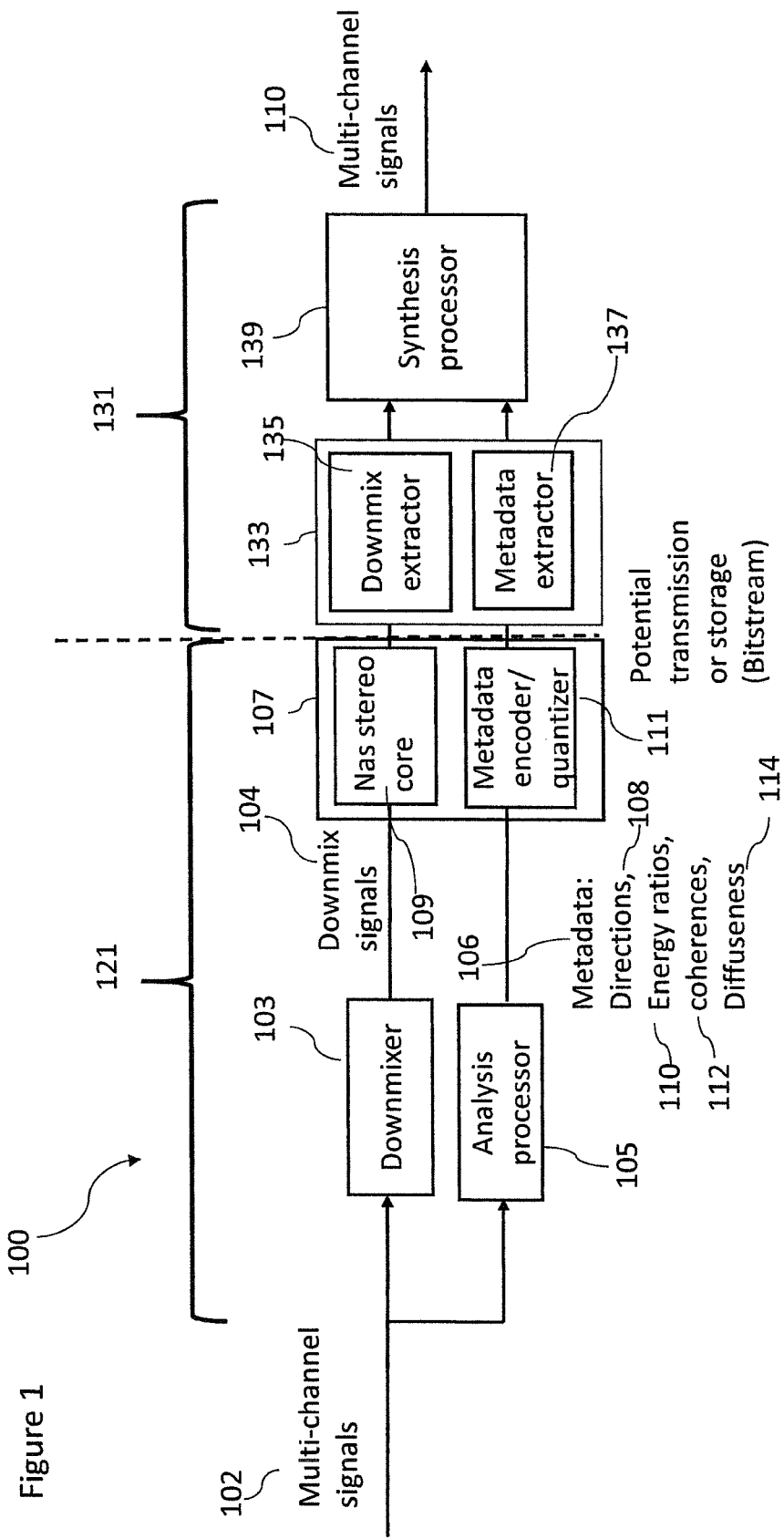
FIG. 1 shows schematically a system of apparatus suitable for implementing some embodiments.

The following describes in further detail suitable apparatus and possible mechanisms for the provision of effective spatial analysis derived metadata parameters for multi-channel input format audio signals. In the following discussions multi-channel system is discussed with respect to a multi-channel microphone implementation. However as discussed above the input format may be any suitable input format, such as multi-channel loudspeaker, ambisonic (FOA/HOA) etc. It is understood that in some embodiments the channel location is based on a location of the microphone or is a virtual location or direction. Furthermore the output of the example system is a multi-channel loudspeaker arrangement. However it is understood that the output may be rendered to the user via means other than loudspeakers. Furthermore the multi-channel loudspeaker signals may be generalised to be two or more playback audio signals.

As discussed previously spatial metadata parameters such as direction and direct-to-total energy ratio (or diffuseness-ratio, absolute energies, or any suitable expression indicating the directionality/non-directionality of the sound at the given time-frequency interval) parameters in frequency bands are particularly suitable for expressing the perceptual properties of natural sound fields. Synthetic sound scenes such as 5.1 loudspeaker mixes commonly utilize audio effects and amplitude panning methods that provide spatial sound that differs from sounds occurring in natural sound fields. In particular, a 5.1 or 7.1 mix may be configured such that it contains coherent sounds played back from multiple directions. For example, it is common that some sounds of a 5.1 mix perceived directly at the front are not produced by a centre (channel) loudspeaker, but for example coherently from left and right front (channels) loudspeakers, and potentially also from the centre (channel) loudspeaker. The spatial metadata parameters such as direction(s) and energy ratio(s) do not express such spatially coherent features accurately. As such other metadata parameters such as coherence parameters may be determined from analysis of the audio signals to express the audio signal relationships between the channels.

As expressed above an example of the incorporation of the direction information in the metadata is to use determined azimuth and elevation values. However conventional uniform azimuth and elevation sampling produces a non-uniform direction distribution.

The concept it thus an attempt to determine a direction parameter for spatial metadata and to index the parameter based on a practical sphere covering based distribution of the directions in order to define a more uniform distribution of directions.

The proposed metadata index may then be used alongside a downmix signal ('channels'), to define a parametric immersive format that can be utilized, e.g., for the Immersive Voice and Audio Service (IVAS) codec. Alternatively and in addition, the spherical grid format can be used in the codec to quantize directions.

The concept furthermore discusses the decoding of such indexed direction parameters to produce quantised directional parameters which can be used in synthesis of spatial audio based on sound-field related parameterization (direction(s) and ratio(s) in frequency bands).

With respect to FIG. 1 an example apparatus and system for implementing embodiments of the application are shown. The system 100 is shown with an 'analysis' part 121 and a 'synthesis' part 131. The 'analysis' part 121 is the part from receiving the multi-channel loudspeaker signals up to an encoding of the metadata and downmix signal and the 'synthesis' part 131 is the part from a decoding of the encoded metadata and downmix signal to the presentation of the re-generated signal (for example in multi-channel loudspeaker form).

The input to the system 100 and the 'analysis' part 121 is the multi-channel signals 102. In the following examples a microphone channel signal input is described, however any suitable input (or synthetic multi-channel) format may be implemented in other embodiments.

The multi-channel signals are passed to a downmixer 103 and to an analysis processor 105.

In some embodiments the downmixer 103 is configured to receive the multi-channel signals and downmix the signals to a determined number of channels and output the downmix signals 104. For example the downmixer 103 may be configured to generate a 2 audio channel downmix of the multi-channel signals. The determined number of channels may be any suitable number of channels. In some embodiments the downmixer 103 is optional and the multi-channel signals are passed unprocessed to an encoder 107 in the same manner as the downmix signal are in this example.

In some embodiments the analysis processor 105 is also configured to receive the multi-channel signals and analyse the signals to produce metadata 106 associated with the multi-channel signals and thus associated with the downmix signals 104. The analysis processor 105 may be configured to generate the metadata which may comprise, for each time-frequency analysis interval, a direction parameter 108, an energy ratio parameter 110, a coherence parameter 112, and a diffuseness parameter 114. The direction, energy ratio and diffuseness parameters may in some embodiments be considered to be spatial audio parameters. In other words the spatial audio parameters comprise parameters which aim to characterize the sound-field created by the multi-channel signals (or two or more playback audio signals in general). The coherence parameters may be considered to be signal relationship audio parameters which aim to characterize the relationship between the multi-channel signals.

In some embodiments the parameters generated may differ from frequency band to frequency band. Thus for example in band X all of the parameters are generated and transmitted, whereas in band Y only one of the parameters is generated and transmitted, and furthermore in band Z no parameters are generated or transmitted. A practical example of this may be that for some frequency bands such as the highest band some of the parameters are not required for perceptual reasons. The downmix signals 104 and the metadata 106 may be passed to an encoder 107.

The encoder 107 may comprise a IVAS stereo core 109 which is configured to receive the downmix (or otherwise) signals 104 and generate a suitable encoding of these audio signals. The encoder 107 can in some embodiments be a computer (running suitable software stored on memory and on at least one processor), or alternatively a specific device utilizing, for example, FPGAs or ASICs. The encoding may be implemented using any suitable scheme. The encoder 107 may furthermore comprise a metadata encoder or quantizer 109 which is configured to receive the metadata and output an encoded or compressed form of the information. In some embodiments the encoder 107 may further interleave, multiplex to a single data stream or embed the metadata within encoded downmix signals before transmission or storage shown in FIG. 1 by the dashed line. The multiplexing may be implemented using any suitable scheme.

In the decoder side, the received or retrieved data (stream) may be received by a decoder/demultiplexer 133. The decoder/demultiplexer 133 may demultiplex the encoded streams and pass the audio encoded stream to a downmix extractor 135 which is configured to decode the audio signals to obtain the downmix signals. Similarly the decoder/demultiplexer 133 may comprise a metadata extractor 137 which is configured to receive the encoded metadata and generate metadata. The decoder/demultiplexer 133 can in some embodiments be a computer (running suitable software stored on memory and on at least one processor), or alternatively a specific device utilizing, for example, FPGAs or ASICs.

The decoded metadata and downmix audio signals may be passed to a synthesis processor 139.

The system 100 'synthesis' part 131 further shows a synthesis processor 139 configured to receive the downmix and the metadata and re-creates in any suitable format a synthesized spatial audio in the form of multi-channel signals 110 (these may be multichannel loudspeaker format or in some embodiments any suitable output format such as binaural or Ambisonics signals, depending on the use case) based on the downmix signals and the metadata.

Figure 4:
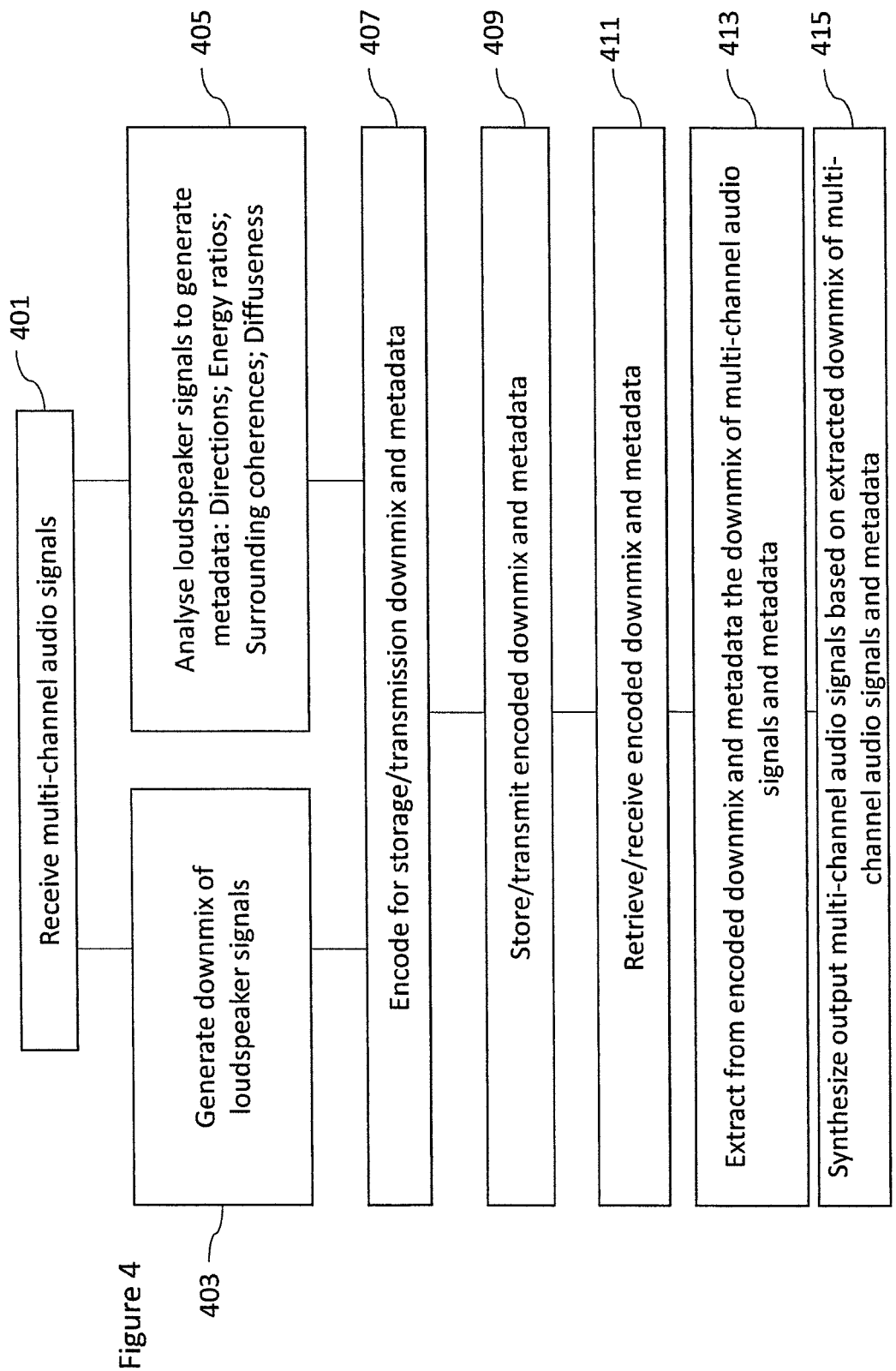
FIG. 4 shows a flow diagram of the operation of the system as shown in FIG. 1 according to some embodiments.

With respect to FIG. 4 an example flow diagram of the overview shown in FIG. 1 is shown.

First the system (analysis part) is configured to receive multi-channel audio signals as shown in FIG. 4 by step 401.

Then the system (analysis part) is configured to generate a downmix of the multi-channel signals as shown in FIG. 4 by step 403.

Also the system (analysis part) is configured to analyse signals to generate metadata such as direction parameters;

energy ratio parameters; diffuseness parameters and coherence parameters as shown in FIG. 4 by step 405.

The system is then configured to encode for storage/transmission the downmix signal and metadata as shown in FIG. 4 by step 407.

After this the system may store/transmit the encoded downmix and metadata as shown in FIG. 4 by step 409.

The system may retrieve/receive the encoded downmix and metadata as shown in FIG. 4 by step 411.

Then the system is configured to extract the downmix and metadata from encoded downmix and metadata parameters, for example demultiplex and decode the encoded downmix and metadata parameters, as shown in FIG. 4 by step 413.

The system (synthesis part) is configured to synthesize an output multi-channel audio signal based on extracted downmix of multi-channel audio signals and metadata with coherence parameters as shown in FIG. 4 by step 415.

Figure 2:
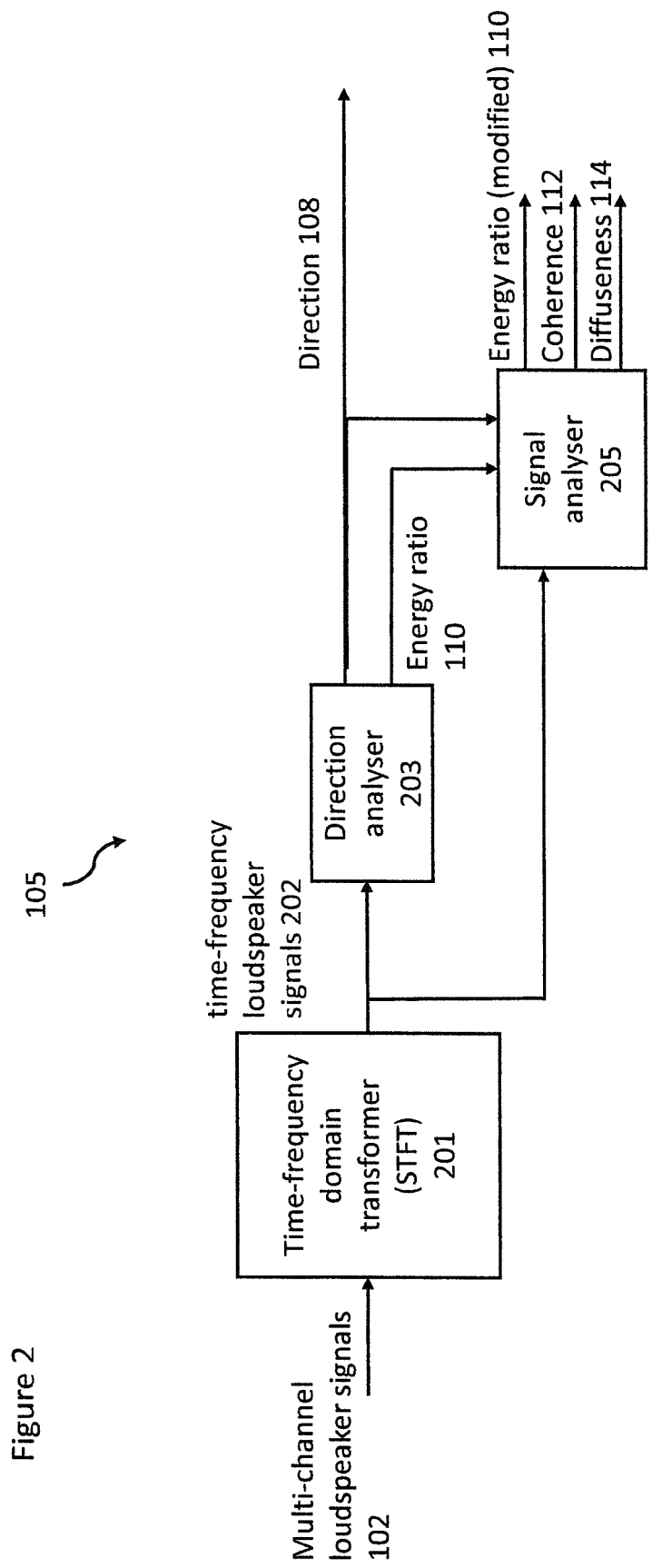
FIG. 2 shows schematically the analysis processor as shown in FIG. 1 according to some embodiments.

With respect to FIG. 2 an example analysis processor 105 (as shown in FIG. 1) according to some embodiments is described in further detail. The analysis processor 105 in some embodiments comprises a time-frequency domain transformer 201.

In some embodiments the time-frequency domain transformer 201 is configured to receive the multi-channel signals 102 and apply a suitable time to frequency domain transform such as a Short Time Fourier Transform (STFT) in order to convert the input time domain signals into a suitable time-frequency signals. These time-frequency signals may be passed to a direction analyser 203 and to a signal analyser 205.

Thus for example the time-frequency signals 202 may be represented in the time-frequency domain representation by $$s_i(b,n),$$

where b is the frequency bin index and n is the frame index and i is the channel index. In another expression, n can be considered as a time index with a lower sampling rate than that of the original time-domain signals. These frequency bins can be grouped into subbands that group one or more of the bins into a band index k=0, . . . , K−1. Each subband k has a lowest bin $b_{k,low}$ and a highest bin $b_{k,high}$, and the subband contains all bins from $b_{k,low}$ to $b_{k,high}$. The widths of the subbands can approximate any suitable distribution. For example the Equivalent rectangular bandwidth (ERB) scale or the Bark scale.

In some embodiments the analysis processor 105 comprises a direction analyser 203. The direction analyser 203 may be configured to receive the time-frequency signals 202 and based on these signals estimate direction parameters 108. The direction parameters may be determined based on any audio based 'direction' determination.

For example in some embodiments the direction analyser 203 is configured to estimate the direction with two or more signal inputs. This represents the simplest configuration to estimate a 'direction', more complex processing may be performed with even more signals.

The direction analyser 203 may thus be configured to provide an azimuth for each frequency band and temporal frame, denoted as azimuth ϕ(k,n) and elevation θ(k,n). The direction parameter 108 may be also be passed to a signal analyser 205

In some embodiments further to the direction parameter the direction analyser 203 is configured to determine an energy ratio parameter 110. The energy ratio may be considered to be a determination of the energy of the audio signal which can be considered to arrive from a direction. The direct-to-total energy ratio r(k,n) can be estimated, e.g., using a stability measure of the directional estimate, or using any correlation measure, or any other suitable method to obtain a ratio parameter.

The estimated direction 108 parameters may be output (and passed to an encoder). The estimated energy ratio parameters 110 may be passed to a signal analyser 205.

In some embodiments the analysis processor 105 comprises a signal analyser 205. The signal analyser 205 is configured to receive parameters (such as the azimuth ϕ(k,n) and elevation θ(k,n) 108, and the direct-to-total energy ratios r(k,n) 110) from the direction analyser 203. The signal analyser 205 may be further configured to receive the time-frequency signals ($s_i(b,n)$) 202 from the time-frequency domain transformer 201. All of these are in the time-frequency domain; b is the frequency bin index, k is the frequency band index (each band potentially consists of several bins b), n is the time index, and i is the channel.

Although directions and ratios are here expressed for each time index n, in some embodiments the parameters may be combined over several time indices. Same applies for the frequency axis, as has been expressed, the direction of several frequency bins b could be expressed by one direction parameter in band k consisting of several frequency bins b. The same applies for all of the discussed spatial parameters herein.

The signal analyser 205 is configured to produce a number of signal parameters. In the following disclosure there are the two parameters: coherence and diffuseness, both analysed in time-frequency domain. In addition, in some embodiments the signal analyser 205 is configured to modify the estimated energy ratios (r(k, n)). The signal analyser 205 is configured to generate the coherence and diffuseness parameters based on any suitable known method.

Figure 5:
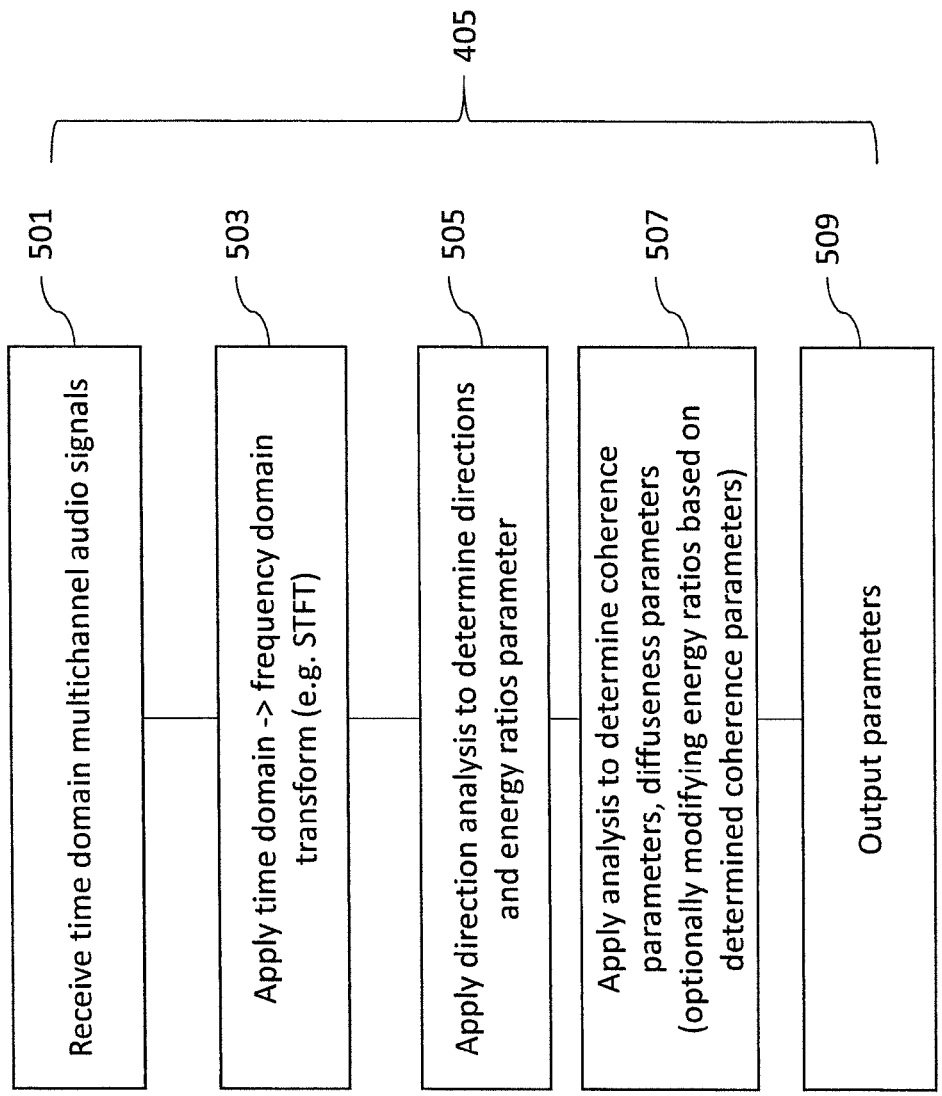
FIG. 5 shows a flow diagram of the operation of the analysis processor as shown in FIG. 2 according to some embodiments.

With respect to FIG. 5 a flow diagram summarising the operations of the analysis processor 105 are shown.

The first operation is one of receiving time domain multichannel (loudspeaker) audio signals as shown in FIG. 5 by step 501.

Following this is applying a time domain to frequency domain transform (e.g. STFT) to generate suitable time-frequency domain signals for analysis as shown in FIG. 5 by step 503.

Then applying direction analysis to determine direction and energy ratio parameters is shown in FIG. 5 by step 505.

Then applying analysis to determine coherence parameters (such as surrounding and/or spread coherence parameters) and diffuseness parameters is shown in FIG. 5 by step 507. In some embodiments the energy ratio may also be modified based on the determined coherence parameters in this step.

The final operation being one of outputting the determined parameters is shown in FIG. 5 by step 509.

Figure 3A:
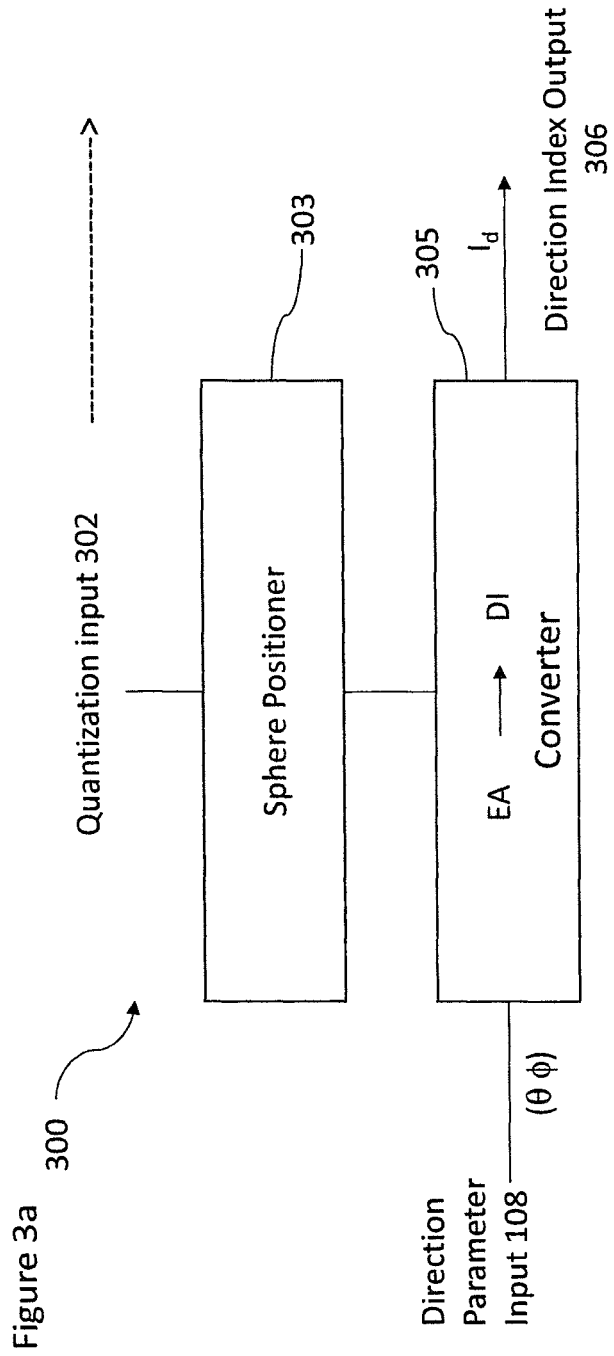
FIG. 3a shows schematically the metadata encoder/quantizer as shown in FIG. 1 according to some embodiments.

With respect to FIG. 3a an example metadata encoder and specifically the direction metadata encoder 300 is shown according to some embodiments.

The direction metadata encoder 300 in some embodiments comprises a quantization input 302. The quantization input, which may also be known as an encoding input is configured to define the granularity of spheres arranged around a reference location or position from which the direction parameter is determined. In some embodiments the quantization input is a predefined or fixed value. The direction metadata encoder 300 in some embodiments comprises a sphere positioner 303. The sphere positioner is configured to configure the arrangement of spheres based on the quantization input value. The proposed spherical grid uses the idea of covering a sphere with smaller spheres and considering the centres of the smaller spheres as points defining a grid of almost equidistant directions, such that the spherical grid comprises a number of points arranged in a form of a sphere.

Figure 3B:
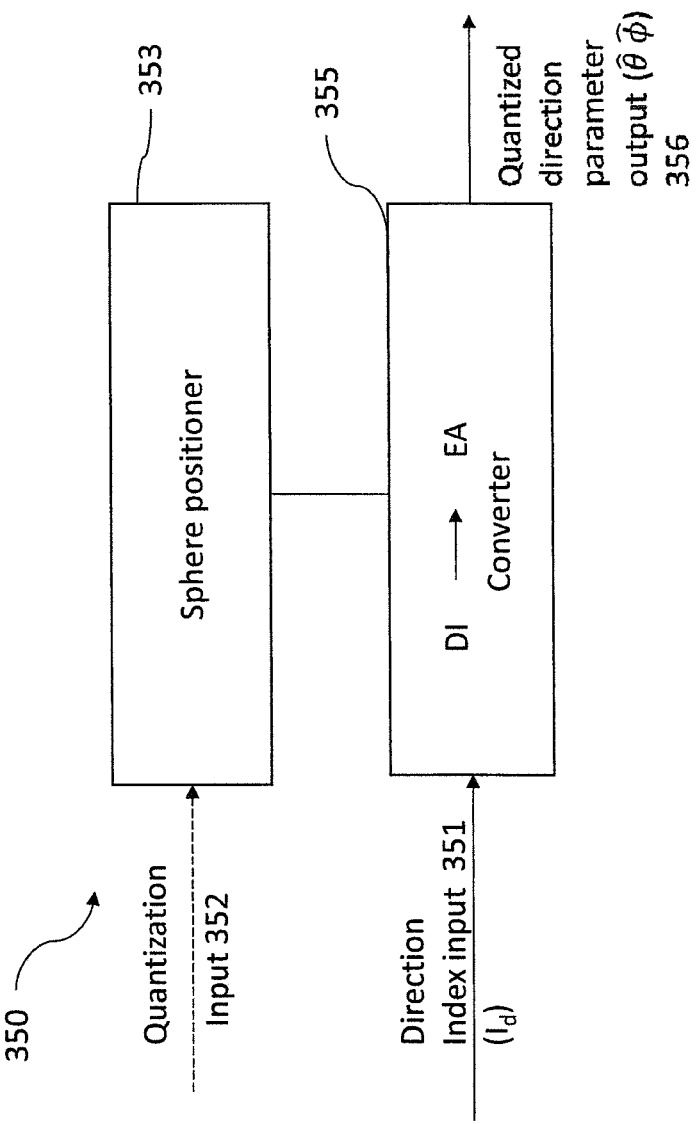
FIG. 3b shows schematically the metadata extractor as shown in FIG. 1 according to some embodiments.

The concept as shown herein is one in which a sphere is defined relative to the reference location. The sphere can be visualised as a series of circles (or intersections) and for each circle intersection there are located at the circumference of the circle a defined number of (smaller) spheres. This is shown for example with respect to FIGS. 3c to 3e. For example FIG. 3c shows an example 'equatorial cross-section' or a first main circle 370 which has a radius defined as the 'main sphere radius. Also shown in FIG. 3c are the smaller spheres (shown as circle cross-sections) 371, 373, 375, 377 and 379 located such that each smaller sphere has a circumference which at one point touches the main sphere circumference and at least one further point which touches at least one further smaller sphere circumference. Thus as shown in FIG. 3c the smaller sphere 371 touches main sphere 370 and smaller sphere 373, smaller sphere 373 touches main sphere 370 and smaller spheres 371 and 375, smaller sphere 375 touches main sphere 370 and smaller spheres 373 and 377, smaller sphere 377 touches main sphere 370 and smaller spheres 375 and 379, and smaller sphere 379 touches main sphere 370 and smaller sphere 377.

Figure 3D:
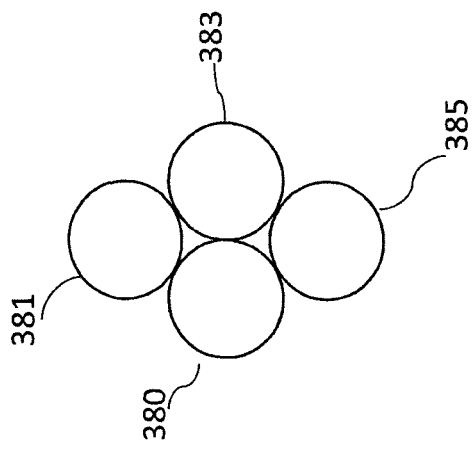
FIGS. 3c to 3e shows schematically example sphere location configurations as used in the metadata encoder/quantizer and metadata extractor as shown in FIGS. 3a and 3b according to some embodiments.
Figure 3C:
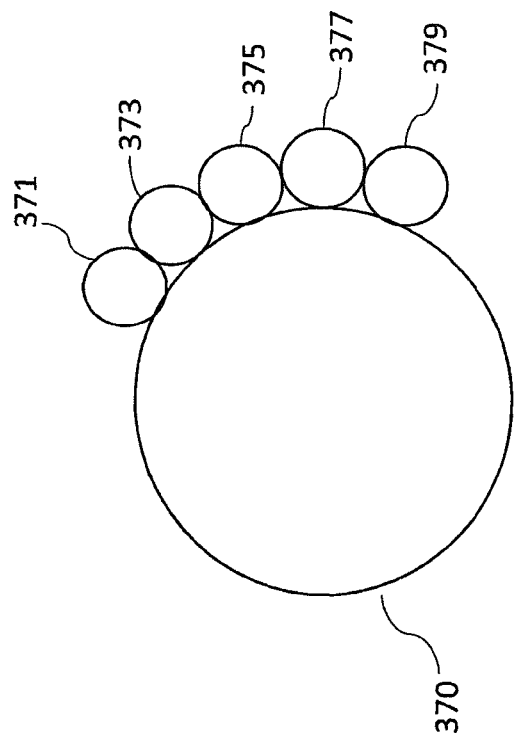

FIG. 3d shows an example 'tropical cross-section' or further main circle 380 and the smaller spheres (shown as circle cross-sections) 381, 383, 385 located such that each smaller sphere has a circumference which at one point touches the main sphere (circle) circumference and at least one further point which touches at least one further smaller sphere circumference. Thus as shown in FIG. 3d the smaller sphere 381 touches main sphere 380 and smaller sphere 383, smaller sphere 383 touches main sphere 380 and smaller spheres 381 and 385, smaller sphere 385 touches main sphere 380 and smaller sphere 383.

Figure 3E:
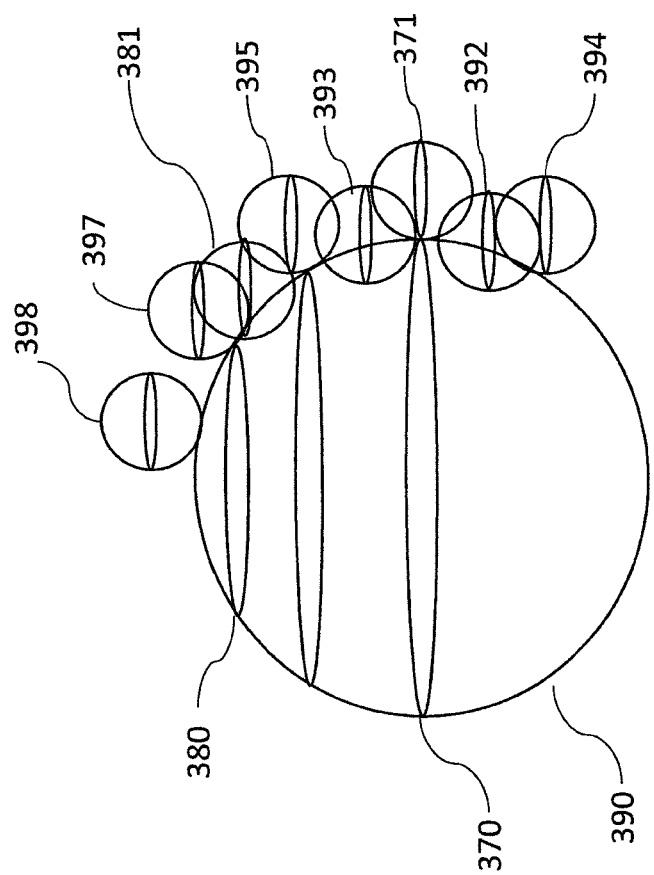

FIG. 3e shows an example sphere and the cross sections 370, 380 and smaller spheres (cross-sections) 371 associated with cross-section 370, smaller sphere 381 associated with cross-section 380 and other smaller spheres 392, 393, 394, 395, 397, 398. In this example only the circles with starting azimuth value at 0 are drawn.

The sphere positioner 303 thus in some embodiments be configured to perform the following operations to define the directions corresponding to the covering spheres:

Input: Quantization input (number of points on the "Equator", n(0) = M)
Output: number of circles, Nc, and number of points on each circle, n(i), i = 0, Nc−1
1. n(0) = M
2. $\alpha = \dfrac{2\pi}{n(0)}$
3. R(0) = 1 (radius of the circle at the Equator)
4. θ(0) = 0 (elevation)
5. $r = 2R(0)\sin\left(\dfrac{\alpha}{4}\right)$ (radius of the smaller spheres)
6. ϕ(0) = 0
7. $p = \arcsin\left(r\dfrac{\sqrt{3}}{R(0)}\right)$
8. R(1) = R(0) cos p
9. i = 1
10. While n(i − 1) > 1
   a. $n(i) = \left\lfloor \dfrac{\pi R(i)}{r} \right\rfloor$ (this is valid when $r \ll R(0)$)
   b. θ(i) = p · i
   c. $\Delta\phi(i) = \dfrac{\pi}{n(i-1)}$ (granularity of the azimuth on the circle i)
   d. R(i + 1) = R(i) cos((i + 1) · p)
   e. If i is odd
      i. $\phi_0(i) = \dfrac{\Delta\phi(i)}{2}$ (first azimuth value on circle i)
   f. Else
      i. ϕ₀(i) = 0
   g. End if
   h. i = i + 1
11. End while
12. Nc = i + 1

Step 5 can be also replaced by r=2 R(0)sin(α/k) where the factor k controls the distribution of points along the elevation. For k=4, the elevation resolution is approximately 1 degree. For smaller k, the resolution is correspondingly smaller.

The elevation for each point on the circle i is given by the values in θ(i). For each circle above the Equator there is a corresponding circle under the Equator.

Each direction point on one circle can be indexed in increasing order with respect to the azimuth value. The index of the first point in each circle is given by an offset that can be deduced from the number of points on each circle, n(i). In order to obtain the offsets, for a considered order of the circles, the offsets are calculated as the cumulated number of points on the circles for the given order, starting with the value 0 as first offset.

One possible order of the circles could be to start with the Equator followed by the first circle above the Equator, then the first under the Equator, the second one above the Equator, and so on.

Another option is to start with the Equator, then the circle above the Equator that is at an approximate elevation of 45 degrees and then the corresponding circle under the Equator, and then the remaining circles in alternative order. This way for some simpler positioning of loudspeakers, only the first circles are used, reducing the number of bits to send the information.

Other ordering of the circles are also possible in other embodiments.

In some embodiments the spherical grid can also be generated by considering the meridian 0 instead of the Equator, or any other meridian.

The sphere positioner having determined the number of circles and the number of circles, Nc, number of points on each circle, n(i), i=0, Nc−1 and the indexing order can be configured to pass this information to an EA to DI converter 305.

The direction metadata encoder 300 in some embodiments comprises a direction parameter input 108. The direction parameter input may define an elevation and azimuth value D=(θ,ϕ).

The transformation procedures from (elevation/azimuth) (EA) to direction index (DI) and back are presented in the following paragraphs. The alternative ordering of the circles is considered here.

The direction metadata encoder 300 comprises an elevation-azimuth to direction index (EA-DI) converter 305. The elevation-azimuth to direction index converter 305 in some embodiments is configured to receive the direction parameter input 108 and the sphere positioner information and convert the elevation-azimuth value from the direction parameter input 108 to a direction index by quantizing the elevation—azimuth value.

Figure 6:
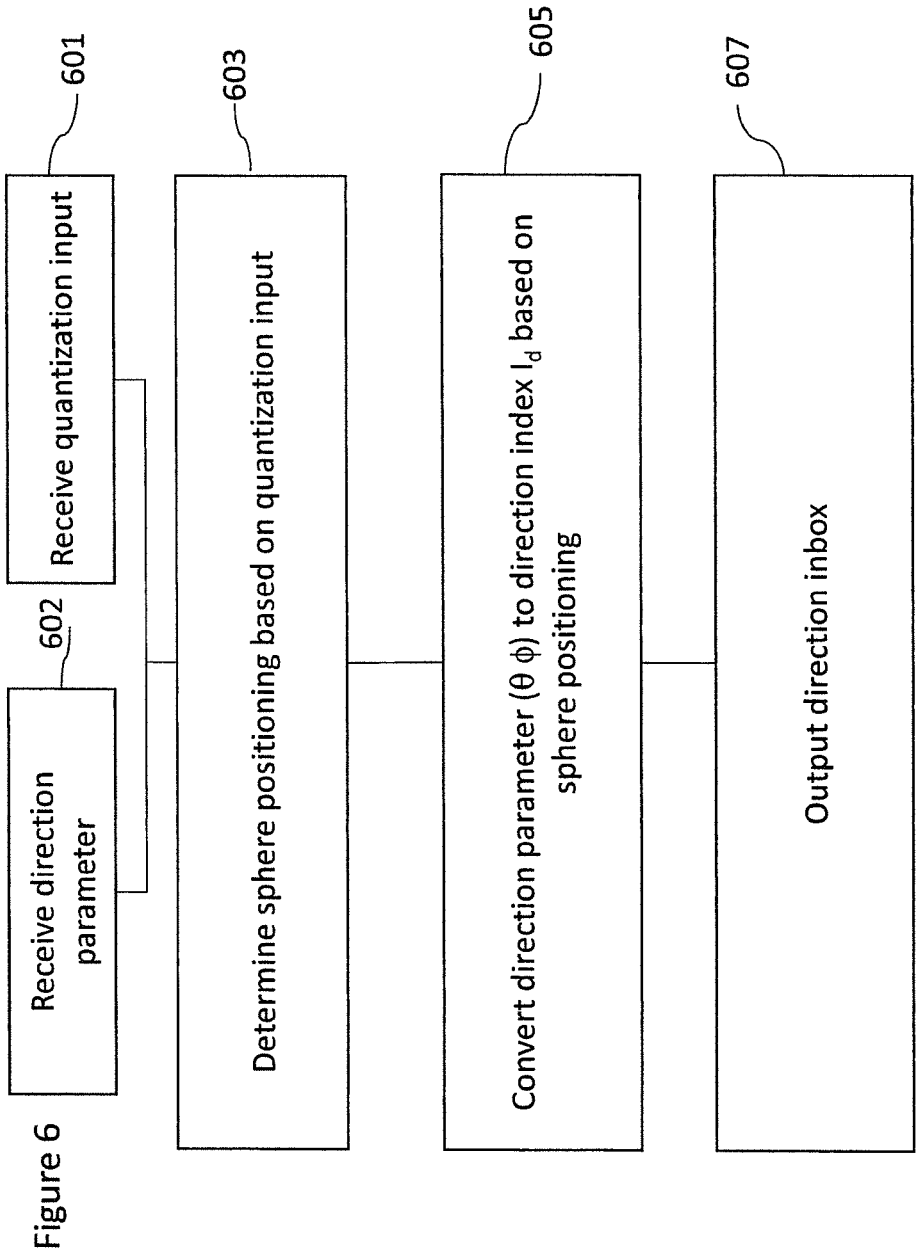
FIG. 6 shows a flow diagram of generating a direction index based on an input direction parameter in further detail.

With respect to FIG. 6 an example method for generating the direction index according to some embodiments is shown.

The receiving of the quantization input is shown in FIG. 6 by step 601.

Then the method may determine sphere positioning based on the quantization input as shown in FIG. 6 by step 603.

Also the method may comprise receiving the direction parameter as shown in FIG. 6 by step 602.

Having receiving the direction parameter and the sphere positioning information the method may comprise converting the direction parameter to a direction index based on the sphere positioning information as shown in FIG. 6 by step 605.

The method may then output the direction index as shown in FIG. 6 by step 607.

In some embodiments the elevation-azimuth to direction index (EA-DI) converter 305 is configured to perform this conversion according to the following algorithm:

$$\text{Input: } (\theta, \phi), \theta \in S_\theta \subset \left[-\frac{\pi}{2}, \frac{\pi}{2}\right], \phi \in S_\phi \subset [0, 2\pi]$$

$$\text{Output: } I_d$$

In some embodiments $S_\theta$ may take the form of an indexed codebook with N discrete entries, each entry $\theta_i$ corresponding to a value of elevation for i=0:N−1. Additionally, the codebook also comprises for each discrete elevation value $\theta_i$ a set of discrete azimuth values $\phi_j$ where the number of azimuth values in the set is dependent in the elevation $\theta_i$. In other words for each elevation entry $\theta_i$ there can be differing numbers of discrete azimuth values $\phi_j$ for j=0:f($\theta_i$), where f($\theta_i$) denotes that number of azimuth values in the set of azimuth values associated with the elevation value $\theta_i$ is a function of the elevation value $\theta_i$.

In other embodiments the indexing of the elevation-azimuth value may not use a codebook structure as above for storing discrete elevation and azimuth values. Instead linear quantization can be used where the number of circles $N_c$ and the granularity p as provided by the sphere positioner can be used to uniformly divide the range of elevation from $$-\frac{\pi}{2} \text{ to } \frac{\pi}{2}.$$

The position on the elevation range gives a circle index, and the number of azimuth discrete points and corresponding offset, off(i) are known.

$$\text{Find the circle index } i = \begin{cases} 2\frac{\theta}{p} - 1, & \text{if } \theta > 0 \\ 0, & \text{if } \theta = 0 \\ -2\frac{\theta}{p}, & \text{if } \theta < 0 \end{cases} \quad 1$$

$$\text{Find the index of azimuth within the circle } i: j = \left\lfloor \frac{\phi}{\Delta\phi(i')} \right\rfloor \quad 2$$

$$\text{where } i' = \left|\frac{\theta}{p}\right|$$

$$\text{The direction index is } I_d = \text{off}(i) + j \quad 3$$

The explanation of the EA-DI indexing method shall proceed on the basis of the above codebook structure as explained above. However, it is to be understood that the following method can be equally applied to a uniform quantizer structure in which the elevation range is divided along a scale $$-\frac{\pi}{2} \text{ to } \frac{\pi}{2}.$$

Figure 7:
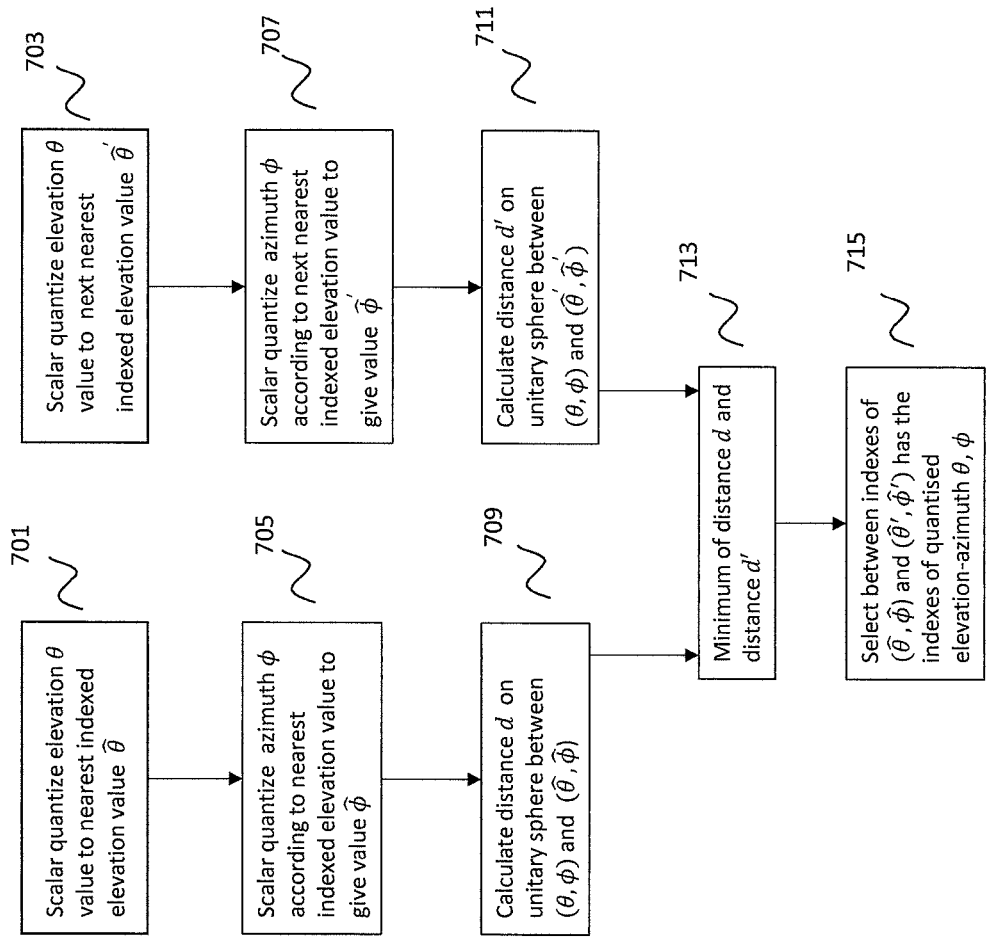
FIG. 7 shows a flow diagram of an example operation of quantizing the direction parameter to obtain a direction index.

With respect to FIG. 7 an example method is shown of the step 605 in FIG. 6 for converting elevation-azimuth to direction index (EA-DI).

The first step of quantizing an elevation-azimuth value may comprise scalar quantising the elevation value θ by finding the closest codebook entry $\theta_i$ to give a first quantised elevation value $\hat{\theta}=\theta_i$. The elevation value θ can again be scalar quantized by finding the next closest codebook entry. This may be given as either of the codebook entries $\theta_{i+1}$ or $\theta_{i-1}$ depending on which one is closer to θ thereby producing a second quantised elevation value $\hat{\theta}'$.

The processing steps of Scalar quantizing the elevation θ value to the nearest indexed elevation value $\theta_i$ and additionally to the next closest indexed elevation value $\theta_{i+1}$ or $\theta_{i-1}$ are shown as processing steps 701 and 703 respectively.

For each quantised elevation value $\hat{\theta}$ and $\hat{\theta}'$ the corresponding scalar quantized azimuth value can be found. In other words a first scalar quantized azimuth value corresponding to $\hat{\theta}$ can be determined by finding the nearest azimuth value from the set of azimuth values associated with the indexed elevation value $\theta_i$ for the first quantized elevation value $\hat{\theta}$. The first scalar quantized azimuth value corresponding to the first quantized elevation value $\hat{\theta}$ may be expressed as $\hat{\phi}$. Similarly a second scalar quantized azimuth value corresponding to $\hat{\theta}'$ can also be determined and expressed as $\hat{\phi}'$. This can be performed by re-quantising the azimuth value ϕ, however but this time using the set of azimuth values associated with the index of the second scalar quantized elevation value θ'.

The processing steps of Scalar quantizing the azimuth value ϕ corresponding to the nearest indexed elevation value $\theta_i$ and additionally scalar quantizing the azimuth value corresponding to the next closest indexed elevation value $\theta_{i+1}$ or $\theta_{i-1}$ are shown as processing steps 705 and 707 respectively.

Once the first elevation-azimuth scalar quantized pair of values and the second elevation-azimuth scalar quantized pair of values have been determined a distance measure on a unitary sphere for each pair may be calculated. The distance measure can be considered by taking the L2 norm distance between two points on the unitary sphere, so for the first scalar quantized elevation-azimuth pair $(\hat{\theta}, \hat{\phi})$ the distance d is calculated as the distance between the first scalar quantized elevation-azimuth pair $(\hat{\theta}, \hat{\phi})$ and the un-quantised elevation-azimuth pair (θ, ϕ) on the unitary sphere. Similarly for the second scalar quantized elevation-azimuth pair $(\hat{\theta}', \hat{\phi}')$ the distance d' is calculated as the distance between the second scalar quantized elevation-azimuth pair $(\hat{\theta}', \hat{\phi}')$ and the un-quantised elevation-azimuth pair (θ, ϕ) on the unitary sphere.

It is to be appreciated in embodiments that the L2 norm distance between two points x and y on a unitary sphere may be considered from $\|x-y\|^2$ where x and y are spherical coordinates in three dimensional space. In terms the elevation-azimuth pair (θ,ϕ) the spherical coordinates can be expressed as x=(r cos(θ)cos(ϕ), r cos(θ)sin(ϕ), r sin(θ)) and for the elevation-azimuth pair (θ̂, ϕ̂) the spherical coordinates correspond to y=(r cos(θ̂)cos(ϕ̂), r cos(θ̂)sin(ϕ̂), r sin(θ̂)). By considering a unitary sphere the radius r=1, and the distance d can be reduced to the calculation d=−(sin(θ) sin(θ̂)+cos(θ)cos(θ̂)cos(ϕ−ϕ̂)), where it can be seen that the distance d is solely dependent on the values of the angles.

Similarly the distance d' between the second scalar quantized elevation-azimuth pair (θ̂', ϕ̂') and the un-quantised elevation-azimuth pair (θ,ϕ) on the unitary sphere can be expressed as d'=−(sin(θ)sin(θ̂')+cos(θ)cos(θ̂')cos(ϕ−ϕ̂')).

The processing step of finding the distance between the first scalar quantized elevation-azimuth pair (θ̂, ϕ̂) and the un-quantised elevation-azimuth pair (θ, ϕ) is shown as 709 in FIG. 7.

The processing step of finding the distance between the second scalar quantized elevation-azimuth pair (θ̂', ϕ̂') and the un-quantised elevation-azimuth pair (θ, ϕ) is shown as 711 in FIG. 7.

Finally, the scalar quantized elevation-azimuth pair which has a minimum distance measure is selected as the quantized elevation-azimuth values for the elevation-azimuth (θ, ϕ). The corresponding indices associated with the selected quantized elevation and azimuth pair then go onto form the direction index $I_d$.

The processing step of finding the minimum distance is shown in FIG. 7 as 713.

The processing step of selecting between indexes of (θ̂, ϕ̂) and (θ̂', ϕ̂') has the indexes of quantised elevation-azimuth θ, ϕ in accordance with the minimum distance is shown as 715 in FIG. 7.

It is to be appreciated that even though the above spherical quantization scheme has been defined in terms of a unitary sphere, other embodiments may deploy the above quantization scheme based on a general sphere whose radius is not equal to one. In such embodiments the above step of finding the minimum distance still holds since the minimum distance calculation corresponding to both the first scalar quantized elevation-azimuth pair and second scalar quantized elevation pair is independent or the radius r.

It is to be noted that the above processing steps for finding the direction index $I_d$ corresponding to the selected quantised values for the elevation-azimuth pair (θ, ϕ) has been described in terms of a preferred embodiment using a first and a second scalar quantised values for the elevation value θ. However, other embodiments may start from a position of using more than two different scalar quantised values for the elevation θ. In such embodiments the closest codebook entries to the elevation value θ can be selected as the quantised elevation values upon which the proceeding calculations are based. Accordingly in such embodiments there will be a final comparison over a corresponding number of distance measures with the scalar quantised elevation-azimuth pair producing the minimum distance being selected as the quantized elevation-azimuth value for the elevation-azimuth (θ, ϕ).

It is to be appreciated that the operation of indexing as described above can refer to the process of assigning a quantized value to a specific value of a parameter, and then using an index to refer to or reference the quantized parameter value. The index representing the quantized parameter value can either be stored or transmitted as part of an encoded bit stream.

It is to be further appreciated that the above distortion measure, based on the distance between two points on a unitary sphere, can be used in any directional component quantization scheme using the elevation and azimuth values as vector components. To this end in other embodiments an elevation/azimuth vector can be quantised using a vector codebook comprising a plurality of elevation/azimuth codevectors. The vector codebook can be searched using the nearest neighbour search routine in which the elevation/azimuth codevector with the minimum distance measure is selected as being the closest codevector to the elevation/azimuth vector. In this embodiment the direction index is then determined to be the index of the closest elevation/azimuth codevector. It is to be noted that the distance measure used for the nearest neighbour search routine of the vector codebook can be the same as the L2 norm distance between two points x and y on a sphere as described above for the case of the spherical grid. That is for the elevation-azimuth pair (θ, ϕ) the spherical coordinates can be expressed as x=(r cos(θ)cos(ϕ), r cos(θ)sin(ϕ), r sin(θ)) and for a elevation/azimuth codevector (θ̂, ϕ̂) the spherical coordinates correspond to y=(r cos(θ̂)cos(ϕ̂), r cos(θ̂)sin(ϕ̂), r sin(θ̂)).Therefore the distance measure between the elevation/azimuth vector and an elevation/azimuth codevector from the vector codebook can also be reduced reduced to the calculation d=−(sin(θ)sin(θ̂)+cos(θ)cos(θ̂)cos(ϕ−ϕ̂)) for a unitary sphere.

The direction index $I_d$ 306 may be output.

With respect to FIG. 3b an example metadata extractor 137 and specifically a direction metadata extractor 350 is shown according to some embodiments.

The direction metadata extractor 350 in some embodiments comprises a quantization input 352. This in some embodiments is passed from the metadata encoder or is otherwise agreed with the encoder. The quantization input is configured to define the granularity of spheres arranged around a reference location or position.

The direction metadata extractor 350 in some embodiments comprises a direction index input 351. This may be received from the encoder or retrieved by any suitable means.

The direction metadata extractor 350 in some embodiments comprises a sphere positioner 353. The sphere positioner 353 is configured to receive as an input the quantization input and generate the sphere arrangement in the same manner as generated in the encoder. In some embodiments the quantization input and the sphere positioner 353 is optional and the arrangement of spheres information is passed from the encoder rather than being generated in the extractor.

The direction metadata extractor 350 comprises a direction index to elevation-azimuth (DI-EA) converter 355. The direction index to elevation-azimuth converter 355 is configured to receive the direction index and furthermore the sphere position information and generate an approximate or quantized elevation-azimuth output. In some embodiments the conversion is performed according to the following algorithm.

Input: $I_d$
Output: (θ, ϕ)
1. Find the circle index i, such that off(i) ≤ $I_d$ ≤ off(i + 1)

2. Calculate the circle index in the hemisphere i' =

$$\begin{cases} \dfrac{i+1}{2} & \text{if } i \text{ is odd} \\ -\dfrac{i}{2} & \text{if } i \text{ is even} \end{cases}$$

3. $\hat{\theta} = \dfrac{i'}{p}$

4. $\hat{\phi} = \begin{cases} \dfrac{I_d - \text{off}(i)}{\Delta\phi(i')}, & \text{if } i' \text{ is odd} \\ \dfrac{I_d - \text{off}(i)}{\Delta\phi(i')} + \dfrac{\Delta\phi(i')}{2}, & \text{if } i' \text{ is even} \end{cases}$ In other embodiments the direction index $I_d$ can be decoded into an elevation index and azimuth index in order to obtain the quantized elevation value θ and quantized azimuth value $\hat{\phi}$ from respective codebooks.

Figure 8:
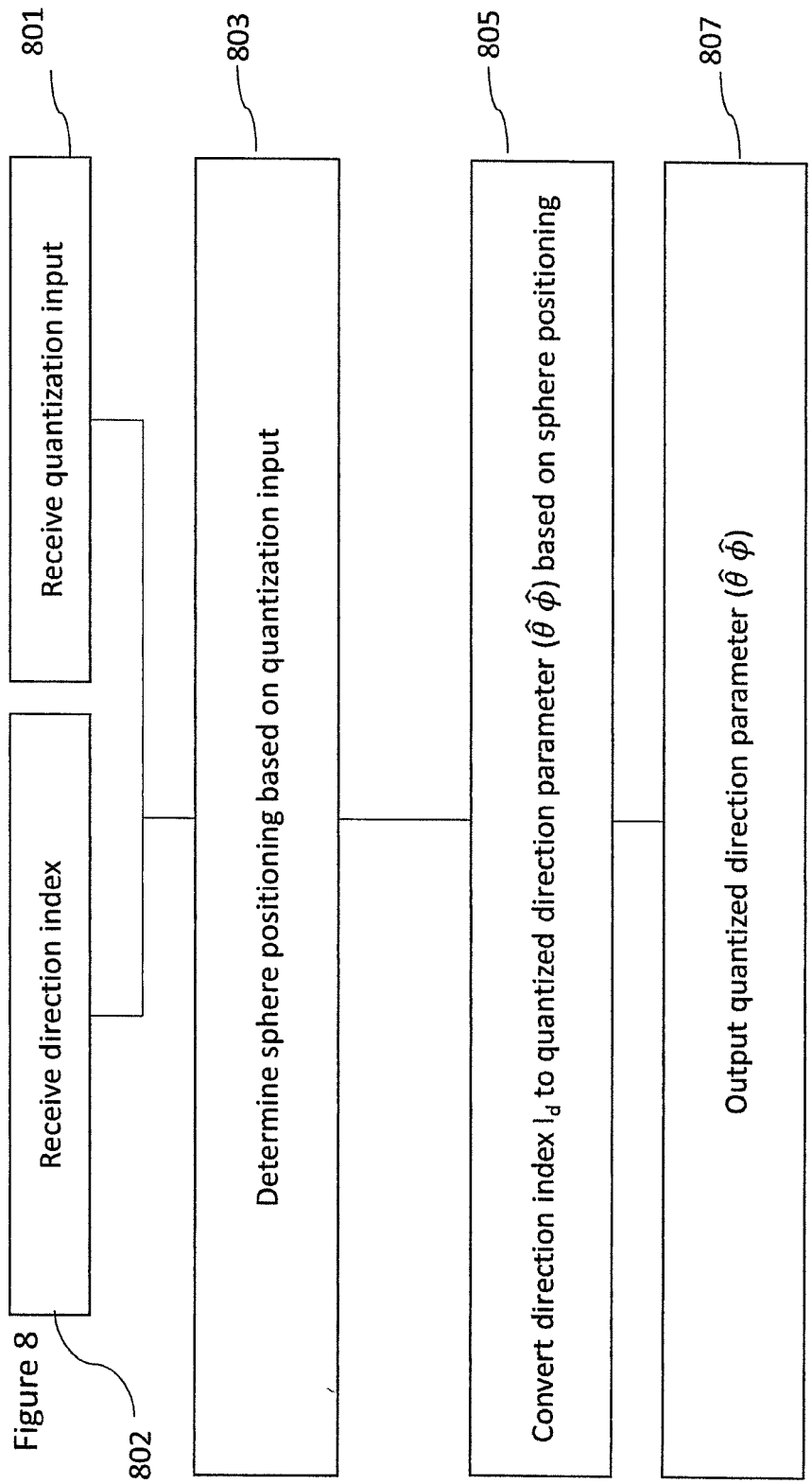
FIG. 8 shows a flow diagram of generating a quantized direction parameter based on an input direction index in further detail.

With respect to FIG. 8 an example method for extracting the direction parameters (or generating quantized direction parameters) according to some embodiments is shown.

The receiving of the quantization input is shown in FIG. 8 by step 801.

Then the method may determine sphere positioning based on the quantization input as shown in FIG. 8 by step 803.

Also the method may comprise receiving the direction index as shown in FIG. 8 by step 802.

Having received the direction index and the sphere positioning information the method may comprise converting the direction index to a direction parameter in the form of a quantized direction parameter based on the sphere positioning information as shown in FIG. 8 by step 805.

The method may then output the quantized direction parameter as shown in FIG. 8 by step 807.

Figure 9:
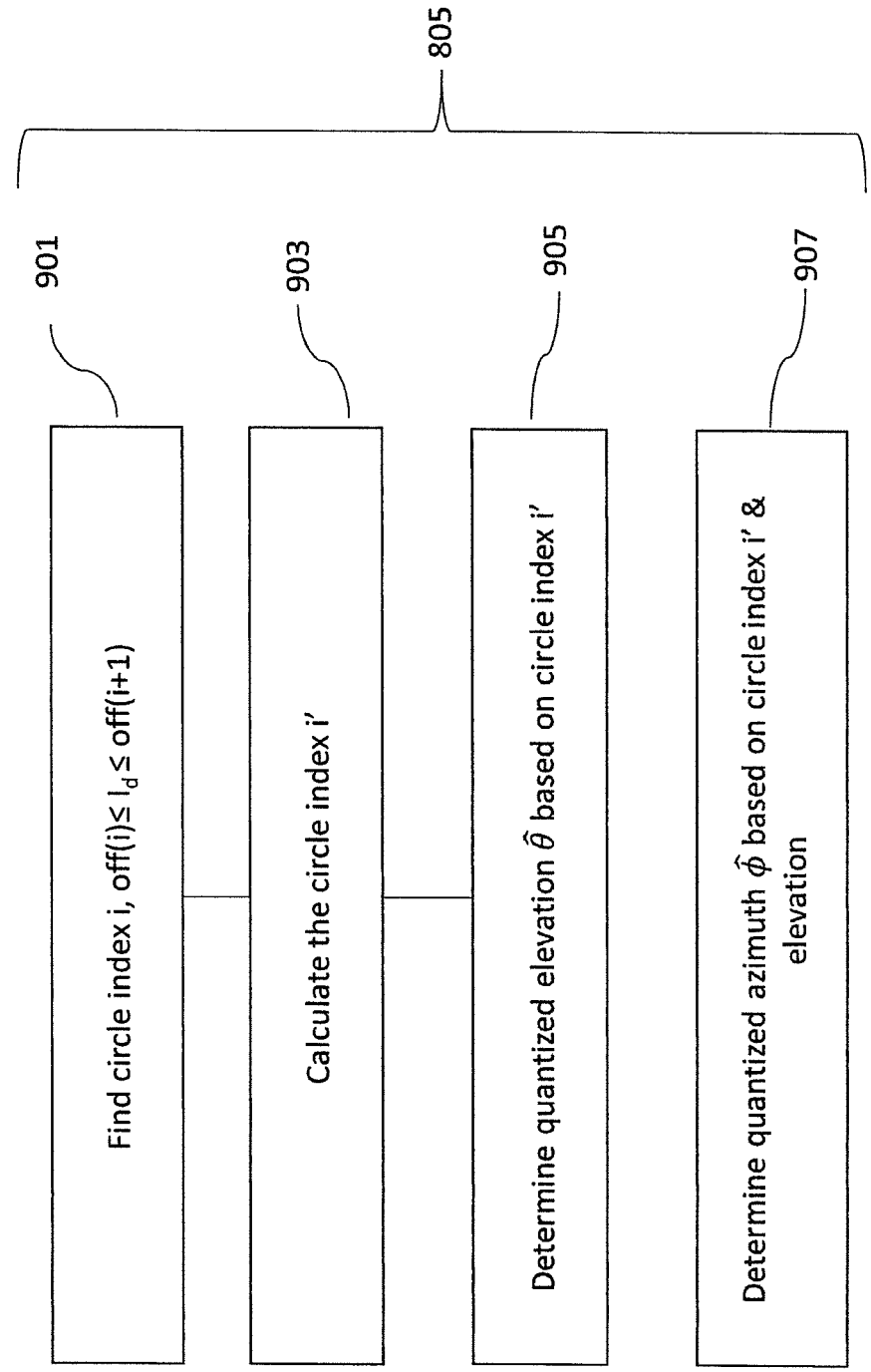
FIG. 9 shows a flow diagram of an example operation of converting a quantized direction parameter from a direction index in further detail.

With respect to FIG. 9 an example method for converting the direction index to a quantized elevation-azimuth (DI-EA) parameter, as shown in FIG. 8 by step 805, according to some embodiments is shown.

In some embodiments the method comprises finding the circle index value i such that off(i)≤$I_d$≤off (i+1) as shown in FIG. 9 by step 901.

Having determined the circle index the next operation is to calculate the circle index in the hemisphere from the sphere positioning information as shown in FIG. 9 by step 903.

Then a quantized elevation is determined based on the circle index as shown in FIG. 9 by step 905.

Having determined the quantized elevation the quantized azimuth is determined based on the circle index and elevation information as shown in FIG. 9 by step 907.

Although not repeated throughout the document, it is to be understood that spatial audio processing, both typically and in this context, takes place in frequency bands. Those bands could be for example, the frequency bins of the time-frequency transform, or frequency bands combining several bins. The combination could be such that approximates properties of human hearing, such as the Bark frequency resolution. In other words, in some cases, we could measure and process the audio in time-frequency areas combining several of the frequency bins b and/or time indices n. For simplicity, these aspects were not expressed by all of the equations above. In case many time-frequency samples are combined, typically one set of parameters such as one direction is estimated for that time-frequency area, and all time-frequency samples within that area are synthesized according to that set of parameters, such as that one direction parameter.

The usage of a frequency resolution for parameter analysis that is different than the frequency resolution of the applied filter-bank is a typical approach in the spatial audio processing systems.

Figure 10:
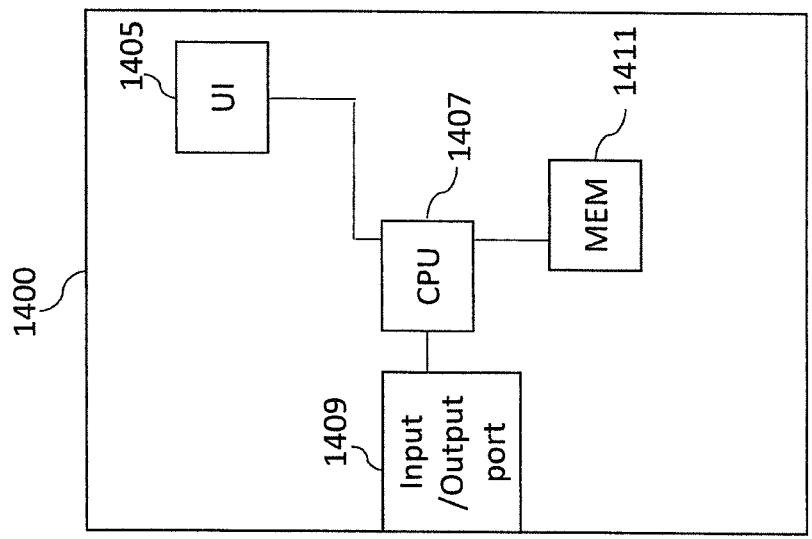
FIG. 10 shows schematically an example device suitable for implementing the apparatus shown.

With respect to FIG. 10 an example electronic device which may be used as the analysis or synthesis device is shown. The device may be any suitable electronics device or apparatus. For example in some embodiments the device 1400 is a mobile device, user equipment, tablet computer, computer, audio playback apparatus, etc.

In some embodiments the device 1400 comprises at least one processor or central processing unit 1407. The processor 1407 can be configured to execute various program codes such as the methods such as described herein.

In some embodiments the device 1400 comprises a memory 1411. In some embodiments the at least one processor 1407 is coupled to the memory 1411. The memory 1411 can be any suitable storage means. In some embodiments the memory 1411 comprises a program code section for storing program codes implementable upon the processor 1407. Furthermore in some embodiments the memory 1411 can further comprise a stored data section for storing data, for example data that has been processed or to be processed in accordance with the embodiments as described herein. The implemented program code stored within the program code section and the data stored within the stored data section can be retrieved by the processor 1407 whenever needed via the memory-processor coupling.

In some embodiments the device 1400 comprises a user interface 1405. The user interface 1405 can be coupled in some embodiments to the processor 1407. In some embodiments the processor 1407 can control the operation of the user interface 1405 and receive inputs from the user interface 1405. In some embodiments the user interface 1405 can enable a user to input commands to the device 1400, for example via a keypad. In some embodiments the user interface 1405 can enable the user to obtain information from the device 1400. For example the user interface 1405 may comprise a display configured to display information from the device 1400 to the user. The user interface 1405 can in some embodiments comprise a touch screen or touch interface capable of both enabling information to be entered to the device 1400 and further displaying information to the user of the device 1400. In some embodiments the user interface 1405 may be the user interface for communicating with the position determiner as described herein.

In some embodiments the device 1400 comprises an input/output port 1409. The input/output port 1409 in some embodiments comprises a transceiver. The transceiver in such embodiments can be coupled to the processor 1407 and configured to enable a communication with other apparatus or electronic devices, for example via a wireless communications network. The transceiver or any suitable transceiver or transmitter and/or receiver means can in some embodiments be configured to communicate with other electronic devices or apparatus via a wire or wired coupling.

The transceiver can communicate with further apparatus by any suitable known communications protocol. For example in some embodiments the transceiver or transceiver means can use a suitable universal mobile telecommunications system (UMTS) protocol, a wireless local area network (WLAN) protocol such as for example IEEE 802.X, a suitable short-range radio frequency communication protocol such as Bluetooth, or infrared data communication pathway (IRDA).

The transceiver input/output port 1409 may be configured to receive the signals and in some embodiments determine the parameters as described herein by using the processor 1407 executing suitable code. Furthermore the device may generate a suitable downmix signal and parameter output to be transmitted to the synthesis device.

In some embodiments the device 1400 may be employed as at least part of the synthesis device. As such the input/output port 1409 may be configured to receive the downmix signals and in some embodiments the parameters determined at the capture device or processing device as described herein, and generate a suitable audio signal format output by using the processor 1407 executing suitable code. The input/output port 1409 may be coupled to any suitable audio output for example to a multichannel speaker system and/or headphones or similar.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs can automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus comprising at least one processor and at least one memory including computer program code, the at least one memory and the computer program code configured to, with the at least one processor, cause the apparatus to:
   determine, for two or more audio signals, at least one spatial audio parameter for providing spatial audio reproduction, the at least one spatial audio parameter comprising a direction parameter with an elevation component and an azimuth component;
   scalar quantise the elevation component to give a first indexed elevation value from a codebook comprising indexed elevation values and indexed azimuth values, wherein the first indexed elevation value is associated with a plurality of indexed azimuth values, and scalar quantise the azimuth component to give a first quantised azimuth value, wherein the first quantised azimuth value is drawn from the plurality of indexed azimuth values associated with the first indexed elevation value;
   scalar quantise the elevation component to give a second indexed elevation value, wherein scalar quantisation of the elevation component is limited to an indexed elevation value whose index is next to the index of the first indexed elevation value from the codebook, wherein the second indexed elevation value is associated with a further plurality of indexed azimuth values, and scalar quantise the azimuth component to give a second indexed azimuth value, wherein the second quantized azimuth value is drawn from the further plurality of indexed azimuth values; and
   select one of the first indexed elevation value and first indexed azimuth value or the second indexed elevation value and the second indexed azimuth value as a quantized elevation component and quantized azimuth component.

2. The apparatus as claimed in claim 1, wherein the apparatus caused to select one of the first indexed elevation value and first indexed azimuth value or the second indexed elevation value and the second indexed azimuth value as an quantized elevation component and quantized azimuth component comprises the apparatus being caused to:
   determine a first distance between a point on a sphere given by the elevation component and azimuth component and a point on the sphere given by the first indexed elevation value and first indexed azimuth value;
   determine a second distance between a point on the sphere given by the elevation and azimuth component and a point on the sphere given by the second indexed elevation value and the second indexed azimuth value; and
   select one of the first indexed elevation value and first indexed azimuth value or the second indexed elevation value and the second indexed azimuth value as the quantized elevation component and quantized azimuth component dependent on a minimum of the first distance and the second distance.

3. The apparatus as claimed in claim 2, wherein the first distance and the second distance are each a L2 norm distance measured between two points on the sphere.

4. The apparatus as claimed in claim 1, wherein the elevation component and azimuth component are indexed to a point on a spherical grid, wherein the spherical grid comprises a number of points arranged in a form of a sphere.

5. The apparatus as claimed in claim 4, wherein the spherical grid is formed by covering the sphere with smaller spheres, wherein the smaller spheres define the points of the spherical grid.

6. The apparatus as claimed in claim 1, wherein the elevation component and azimuth component are components of an azimuth/elevation vector, wherein the apparatus caused to convert the elevation component and azimuth component of the direction parameter to an index value is caused to:
- determine a first distance measure between the azimuth/elevation vector and a first azimuth/elevation codevector from a vector codebook comprising a plurality of azimuth/elevation codevectors and determine a second distance measure between the azimuth/elevation vector and a second azimuth/elevation codevector from the vector codebook;
- select a minimum distance measure from the first distance measure and the second distance measure; and
- assign the index value as the index of the azimuth/elevation codevector associated with the minimum distance measure.

7. The apparatus as claimed in claim 6, wherein the first distance and the second distance are each a L2 norm distance measured between two points on a sphere.

8. The apparatus as claimed in claim 3, wherein the sphere is a unitary sphere, and wherein the L2 norm distance between the two points on the unitary sphere is of the form $-(\sin(\theta\_1)\sin(\theta\_2)+\cos(\theta\_1)\cos(\theta\_2)\cos(\phi\_1-\phi\_2))$, wherein $\theta\_1$ and $\theta\_2$ are elevation values for a first point and a second point of the two points, wherein and $\phi\_1$ and $\phi\_2$ are azimuth values for the first and second points of the two points.

9. A method for spatial audio signal encoding comprising:
- determining, for two or more audio signals, at least one spatial audio parameter for providing spatial audio reproduction, the at least one spatial audio parameter comprising a direction parameter with an elevation component and an azimuth component;
- scalar quantising the elevation component to give a first indexed elevation value from a codebook comprising indexed elevation values and indexed azimuth values, wherein the first indexed elevation value is associated with a plurality of indexed azimuth values, and scalar quantising the azimuth component to give a first quantised azimuth value, wherein the first quantised azimuth value is drawn from the plurality of indexed azimuth values associated with the first indexed elevation value;
- scalar quantising the elevation component to give a second indexed elevation value, wherein scalar quantisation of the elevation component is limited to an indexed elevation value whose index is next to the index of the first indexed elevation value from the codebook, wherein the second indexed elevation value is associated with a further plurality of indexed azimuth values, and scalar quantising the azimuth component to give a second indexed azimuth value, wherein the second quantized azimuth value is drawn from the further plurality of indexed azimuth values; and
- selecting one of the first indexed elevation value and first indexed azimuth value or the second indexed elevation value and the second indexed azimuth value as a quantized elevation component and quantized azimuth component.

10. The method as claimed in claim 9, wherein selecting one of the first indexed elevation value and first indexed azimuth value or the second indexed elevation value and the second indexed azimuth value as a quantized elevation component and quantized azimuth component comprises:
- determining a first distance between a point on a sphere given by the elevation component and azimuth component and a point on the sphere given by the first indexed elevation value and first indexed azimuth value;
- determining a second distance between a point on the sphere given by the elevation and azimuth component and a point on the sphere given by the second indexed elevation value and the second indexed azimuth value; and
- selecting one of the first indexed elevation value and first indexed azimuth value or the second indexed elevation value and the second indexed azimuth value as the quantized elevation component and quantized azimuth component dependent on a minimum of the first distance and the second distance.

11. The method as claimed in claim 10, wherein the first distance and the second distance are each a L2 norm distance measured between two points on the sphere.

12. The method as claimed in claim 9, wherein the elevation component and azimuth component are indexed to a point on a spherical grid, wherein the spherical grid comprises a number of points arranged in a form of a sphere.

13. The method as claimed in claim 12, wherein the spherical grid is formed by covering the sphere with smaller spheres, wherein the smaller spheres define the points of the spherical grid.

* * * * *